US009640165B2

(12) United States Patent
Sakamoto et al.

(10) Patent No.: US 9,640,165 B2
(45) Date of Patent: May 2, 2017

(54) ACTIVE VIBRATION NOISE CONTROL APPARATUS

(71) Applicant: HONDA MOTOR CO., LTD., Minato-ku, Tokyo (JP)

(72) Inventors: Kosuke Sakamoto, Utsunomiya (JP); Toshio Inoue, Tochigi-ken (JP)

(73) Assignee: Honda Motor Co., Ltd., Tokyo (JP)

( * ) Notice: Subject to any disclaimer, the term of this patent is extended or adjusted under 35 U.S.C. 154(b) by 680 days.

(21) Appl. No.: 13/686,603

(22) Filed: Nov. 27, 2012

(65) Prior Publication Data

US 2013/0136270 A1 May 30, 2013

(30) Foreign Application Priority Data

Nov. 29, 2011 (JP) ................................ 2011-259685

(51) Int. Cl.
*G10K 11/16* (2006.01)
*H03B 29/00* (2006.01)
*G10K 11/178* (2006.01)

(52) U.S. Cl.
CPC .......... *G10K 11/16* (2013.01); *G10K 11/1782* (2013.01); *G10K 2210/1282* (2013.01); *G10K 2210/12821* (2013.01)

(58) Field of Classification Search
CPC ............... G10K 11/16; G10K 11/1782; G10K 2210/12821; G10K 2210/1282; G10K 11/1788; G10K 11/1786; G10K 11/178
USPC ......... 381/71.4, 71.8, 71.11, 71.1, 86, 71.14, 381/389, 99, 94.1; 700/28
See application file for complete search history.

(56) References Cited

U.S. PATENT DOCUMENTS 5,243,525 A * 9/1993 Tsutsumi et al. ............... 701/37
2002/0059826 A1* 5/2002 Ono ...................... B60C 23/061 73/146.5
2006/0269078 A1 11/2006 Sakamoto et al.
2008/0118083 A1* 5/2008 Mitsuhata .......... G10K 11/1788 381/94.3
2008/0240456 A1 10/2008 Sakamoto et al.
2009/0060217 A1 3/2009 Sakamoto et al.

(Continued)

FOREIGN PATENT DOCUMENTS

EP 1 975 922 A1 10/2008
EP 2 287 046 A1 2/2011

(Continued)

OTHER PUBLICATIONS

Japanese Office Action, Japanese Patent Application No. 2011-259685 dated Mar. 11, 2014.

(Continued)

*Primary Examiner* — Vivian Chin
*Assistant Examiner* — Con P Tran
(74) *Attorney, Agent, or Firm* — Carrier Blackman & Associates, P.C.; Joseph P. Carrier; Anne G. Sabourin

(57) ABSTRACT

An active vibration noise control apparatus is provided. When a vehicle speed changes thereby to change frequency characteristics (peak-amplitude frequency) of vibration noise, the active vibration noise control apparatus refers to a vehicle speed versus frequency correspondence table representing a correspondence relation between a vehicle speed of a vehicle and a frequency of a reference signal, and changes the frequency of the reference signal that is used by an adaptive notch filter.

8 Claims, 8 Drawing Sheets

(56) References Cited

U.S. PATENT DOCUMENTS

| | | | | |
|---|---|---|---|---|
| 2009/0067638 | A1 | 3/2009 | Sakamoto et al. | |
| 2011/0123042 | A1* | 5/2011 | Sakamoto et al. | 381/94.1 |

FOREIGN PATENT DOCUMENTS

| | | | |
|---|---|---|---|
| JP | 05-6188 | A | 1/1993 |
| JP | 06-314097 | A | 11/1994 |
| JP | 2009-045954 | A | 3/2009 |

OTHER PUBLICATIONS

Office Action dated Sep. 17, 2013 issued over the corresponding Japanese Patent Application No. 2011-259685 with the English translation of pertinent portion.

Extended European Search Report, European Patent Application No. 12194482.1; Jun. 7, 2013.

* cited by examiner

ACTIVE VIBRATION NOISE CONTROL APPARATUS

CROSS-REFERENCE TO RELATED APPLICATION

This application is based upon and claims the benefit of priority from Japanese Patent Application No. 2011-259685 filed on Nov. 29, 2011, the contents of which are incorporated herein by reference.

BACKGROUND OF THE INVENTION

Field of the Invention

The present invention relates to an active vibration noise control apparatus for canceling out vibration noise based on road-induced vibrations with a canceling sound (vibration noise canceling sound), and more particularly to an active vibration noise control apparatus suitable for use on vehicles.

Description of the Related Art

While a vehicle is traveling, its road wheels vibrate as they roll on the road, and the vibrations are transmitted through the suspensions to the vehicle body, thereby generating vibration noise, i.e., road noise, in the passenger compartment. There has been proposed an active vibration noise control apparatus that cancels out such vibration noise with a vibration noise canceling sound which is in opposite phase with the vibration noise, at a sound receiving point (evaluation point) where a microphone is positioned (see Japanese Laid-Open Patent Publication No. 2009-045954, hereinafter referred to as JP2009-045954A).

According to the technology disclosed in JP2009-045954A, the active vibration noise control apparatus is constructed as a feedback active vibration noise control apparatus which operates as follows: In order to cancel out vibration noise as road noise having a fixed frequency, i.e., so-called drumming noise, at the sound receiving point, an error signal having the fixed frequency is extracted from error signals generated as signals representing an interference between vibration noise detected by the microphone and the vibration noise canceling sound, using an adaptive notch filter as a bandpass filter (BPF) for the fixed frequency. The extracted error signal is used as a control signal, which is adjusted in phase and gain, i.e. amplitude, to generate a corrected control signal. The corrected control signal is supplied to a speaker, which outputs a vibration noise canceling sound.

SUMMARY OF THE INVENTION

The technology disclosed in JP2009-045954A only requires a very small amount of arithmetic processing and hence makes it possible to construct an active vibration noise control apparatus at a low cost.

However, though the active vibration noise control apparatus disclosed in JP2009-045954A is able to reduce vibration noise very well at a certain constant vehicle speed, it has been found that the vibration noise at the sound receiving point increases when the vehicle speed changes.

In order to clarify such a phenomenon, various measurements, simulations, and study have been carried out as described below.

FIG. 7A of the accompanying drawings shows frequency characteristics of vibration noise detected by a microphone in a vehicle when the vehicle is not under active vibration noise control. In FIG. 7A, a broken-line characteristic curve 202 is plotted when the vehicle travels at a certain vehicle speed Vs1, and a solid-line characteristic curve 204 is plotted when the vehicle travels at another different vehicle speed Vs2. It will be seen from FIG. 7A that the characteristic curve 202 at the vehicle speed Vs1 exhibits a maximum amplitude level of 0 [dB] at a frequency of 70 [Hz], whereas the characteristic curve 204 at the vehicle speed Vs2 exhibits a maximum amplitude level of 0 [dB] at a frequency of 67 [Hz], which is lower than the frequency of 70 [Hz]. In other words, the peak-amplitude frequency of the characteristic curve 204 changes from the peak-amplitude frequency of the characteristic curve 202.

FIG. 7B of the accompanying drawings shows a bandpass characteristic curve (frequency characteristic curve) 206 of an adaptive notch filter that functions as a bandpass filter having a fixed frequency according to a comparative example. The bandpass characteristic curve 206 exhibits a maximum amplitude level of 0 [dB] at a fixed frequency of 70 [Hz]. Therefore, the adaptive notch filter has a peak-amplitude frequency of 70 [Hz] regardless of whether the vehicle is under active vibration noise control or not.

FIG. 7C of the accompanying drawings shows the frequency characteristics (signal spectrums) of control signals output from an adaptive notch filter according to a comparative example. In FIG. 7C, a broken-line characteristic curve 208 is plotted when the vehicle travels at the vehicle speed Vs1, and a solid-line characteristic curve 210 is plotted when the vehicle travels at the other vehicle speed Vs2. FIG. 7C indicates that the characteristic curve 208 at the vehicle speed Vs1 exhibits a maximum amplitude level of 0 [dB] at the frequency of 70 [Hz], whereas the characteristic curve 210 at the vehicle speed Vs2 exhibits a maximum amplitude level of −4 [dB]. Therefore, the peak amplitude of the characteristic curve 210 is lower than the peak amplitude of the characteristic curve 208. In addition, the characteristic curve 210 has its frequency band slightly lower than the characteristic curve 208.

FIG. 8A of the accompanying drawings shows the frequency characteristics of sensitivity plotted when the vehicle is controlled by a vibration noise control process according to a comparative example, i.e., a sensitivity function 212. The sensitivity function 212 is plotted when the vibration noise control process is simulated. Specifically, the sensitivity function 212 indicates a response quantity of vibration noise detected at the sound receiving point of the microphone (i.e., sensitivity [dB]) when the frequency of vibration noise having a constant amplitude is swept from 20 [Hz] to 100 [Hz]. The sensitivity function 212 exhibits a lowest sensitivity of −8 [dB] at the frequency of 70 [Hz], and slight increases and decreases relative to the sensitivity level of 0 [dB] at frequencies lower and higher than the frequency of 70 [Hz].

FIG. 8B of the accompanying drawings shows the frequency characteristics of vibration noise detected by the microphone when a vibration noise control process is carried out by an active vibration noise control apparatus, which has characteristics represented by the sensitivity function 212, according to a comparative example. In FIG. 8B, a broken-line characteristic curve 214 is plotted when the vehicle travels at the vehicle speed Vs1, and a solid-line characteristic curve 216 is plotted when the vehicle travels at the other vehicle speed Vs2. The characteristic curve 214 at the vehicle speed Vs1 exhibits vibration noise that is about −5 [dB] at the peak-amplitude frequency, i.e., vibration noise reduces in comparison with the characteristic curve 202 (see FIG. 7A) plotted when the vehicle is not under active vibration noise control. On the other hand, the characteristic curve 216 at the vehicle speed Vs2 exhibits vibration noise that is about −3 [dB] at the peak-amplitude frequency, relative to the characteristic curve 204 (see FIG. 7A) plotted when the vehicle is not under active vibration noise control. In addition, the characteristic curve 216 also exhibits a noticeable peak amplitude level at about the frequency of 67 [Hz]. The sound of the vibration noise at the frequency of 67 [Hz] is thus selectively heard due to a so-called masking effect. Therefore, it has been found that the noise at the frequency of 67 [Hz] is perceived as being larger.

The present invention has been made in light of the above problems, and the above measurements, simulations and study. It is an object of the present invention to provide an active vibration noise control apparatus for use on a vehicle which, when the speed of the vehicle changes thereby to change the frequency characteristics of the vibration noise, is capable of reducing vibration noise in response to the change in the frequency characteristics of the vibration noise.

According to the present invention, there is provided an active vibration noise control apparatus comprising a vibration noise canceller for outputting a canceling sound based on a canceling signal to cancel out vibration noise, an error signal detector for detecting residual noise due to an interference between the vibration noise and the canceling sound as an error signal, and an active vibration noise controller for generating the canceling signal in response to the error signal input thereto, wherein the active vibration noise controller comprises a reference signal generator for generating a reference signal having a frequency, an adaptive notch filter for outputting a control signal in response to the reference signal input thereto, a phase/amplitude adjuster for storing therein a phase or amplitude adjusting value depending on the frequency of the reference signal, and generating the canceling signal by adjusting a phase or amplitude of the control signal with the phase or amplitude adjusting value, a corrective error signal generator for generating a corrective error signal by subtracting the control signal before the adjustment, from the error signal, a filter coefficient updater for sequentially updating filter coefficients of the adaptive notch filter so as to minimize the corrective error signal based on the reference signal and the corrective error signal, a vehicle speed detector for detecting a vehicle speed of a vehicle which incorporates the active vibration noise control apparatus, and a frequency switcher for storing therein vehicle speed versus frequency correspondence characteristics representing a correspondence relation between the vehicle speed of the vehicle and the frequency of the reference signal, and changing the frequency of the reference signal by referring to the vehicle speed versus frequency correspondence characteristics depending on the vehicle speed.

Even when the vehicle speed changes thereby to change the frequency characteristics of the vibration noise, the active vibration noise control apparatus refers to the vehicle speed versus frequency correspondence characteristics representing a correspondence relation between the vehicle speed of the vehicle and the frequency of the reference signal, and changes the frequency of the reference signal that is used by the adaptive notch filter. The active vibration noise control apparatus can reduce the vibration noise in response to the change in the frequency characteristics of the vibration noise, which is caused by the change in the vehicle speed.

The vehicle speed versus frequency correspondence characteristics should preferably have a region where the frequency of the reference signal decreases as the vehicle speed increases. The vibration noise is produced by road-induced vibrations that are transmitted through a road wheel and a suspension thereof to the passenger compartment of the vehicle. When the vibration noise is thus transmitted, it is considered to increase due to the resonant frequency of the suspension. In this case, the resonant frequency of the suspension is lowered depending on the vehicle speed. This is considered to be one of the reasons why the frequency of the reference signal decreases as the vehicle speed increases.

The active vibration noise control apparatus should preferably further comprise a phase/amplitude switcher for changing the phase or amplitude adjusting value stored in the phase/amplitude adjuster in response to change of the frequency of the reference signal by the frequency switcher. Since the canceling signal is generated by adjusting the phase and amplitude of the control signal based on the changed frequency, the vibration noise can be reduced accurately in response to the change in the frequency characteristics of the vibration noise, which is caused by the change in the vehicle speed.

According to the present invention, inasmuch as the frequency of the reference signal used by the adaptive notch filter is changed depending on the vehicle speed, the vibration noise can be reduced in response to a change in the frequency characteristics of the vibration noise which change depending on a change in the vehicle speed.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

An embodiment of the present invention will be described below with reference to the accompanying drawings.

Figure 1:
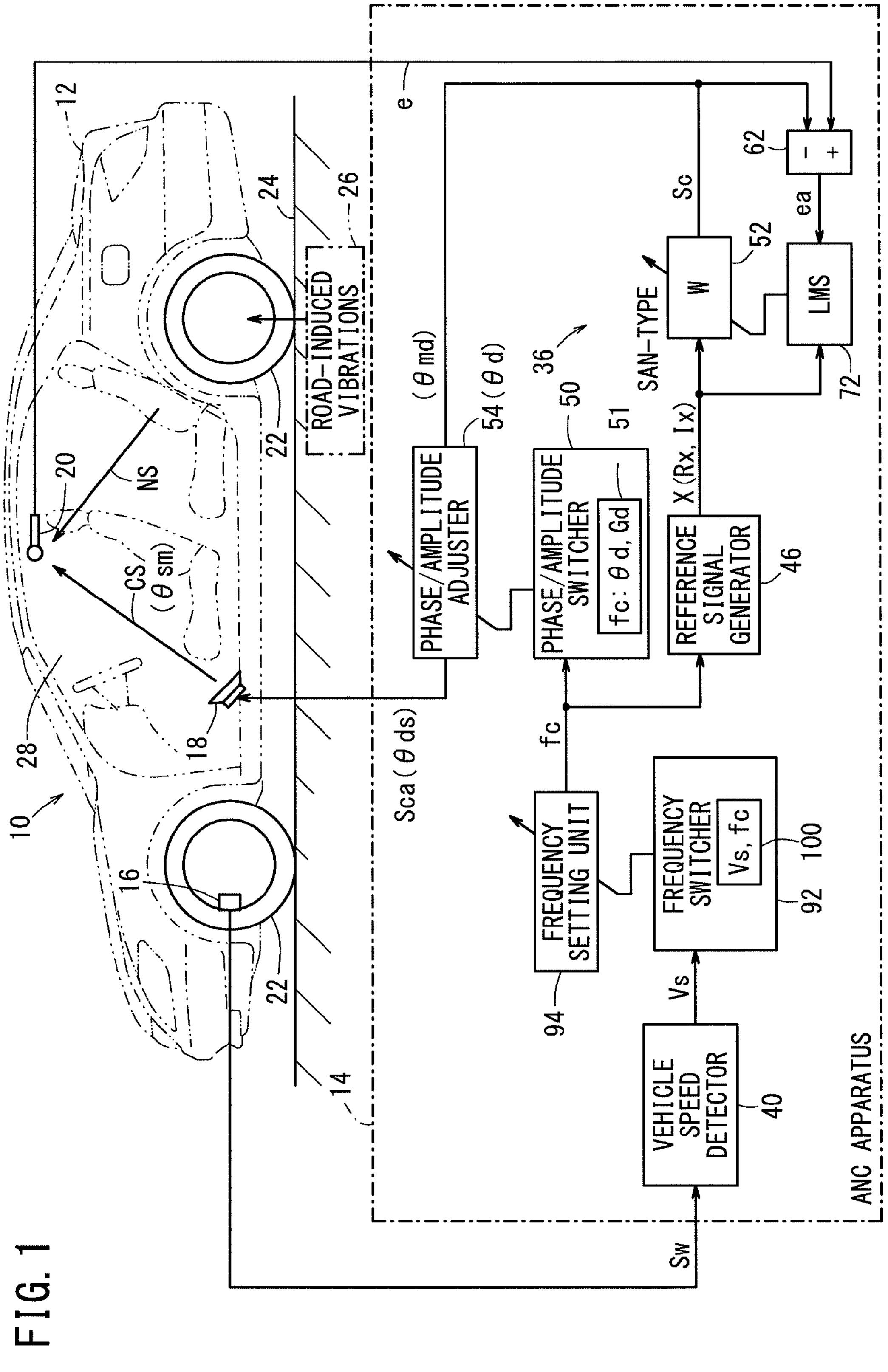
FIG. 1 is a block diagram showing a basic and general arrangement of an active vibration noise control apparatus incorporated in a vehicle according to an embodiment of the present invention.
Figure 2:
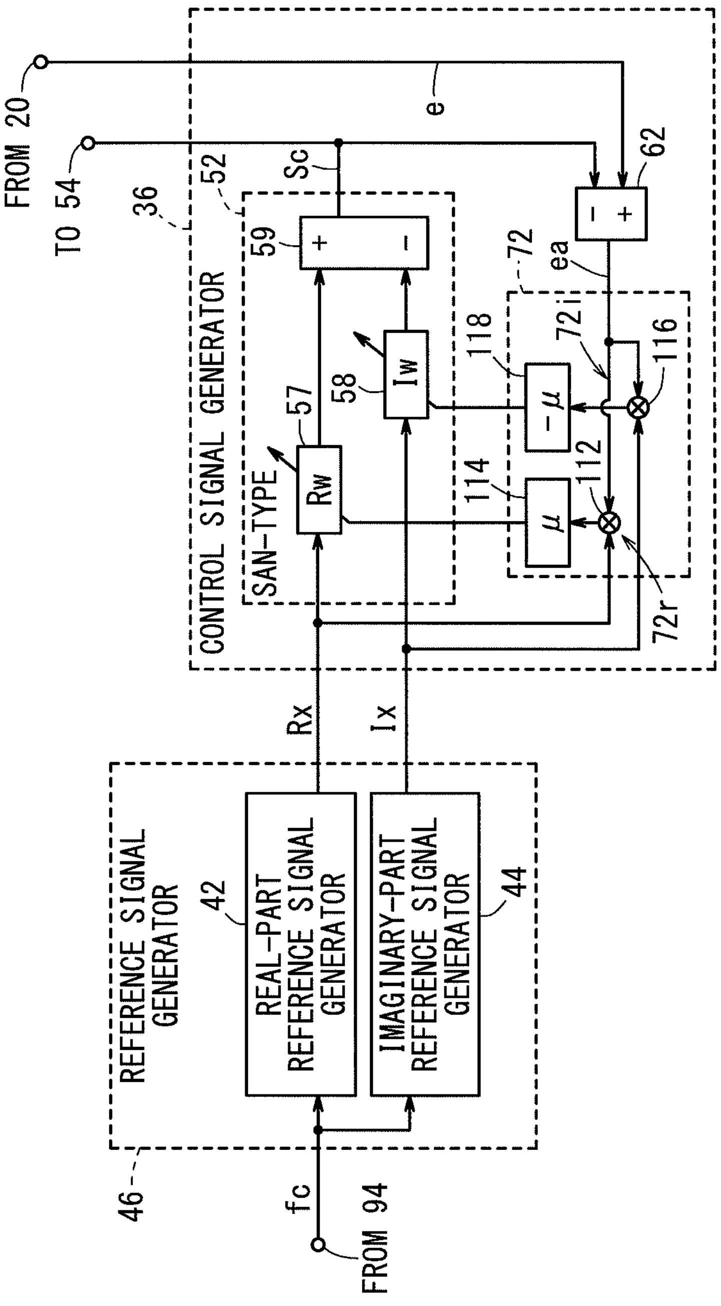
FIG. 2 is a block diagram showing details of a reference signal generator and a control signal generator in the active vibration noise control apparatus shown in FIG. 1.

FIG. 1 shows in block form a basic and general arrangement of an active vibration noise control apparatus 10 incorporated in a vehicle 12 according to an embodiment of the present invention. FIG. 2 shows in block form details of a reference signal generator 46 and a control signal generator 36 in the active vibration noise control apparatus 10 shown in FIG. 1.

As shown in FIGS. 1 and 2, the vehicle 12 includes an active noise control apparatus (ANC apparatus, active vibration noise controller) 14, a road wheel speed sensor 16 mounted on a road wheel 22 as a vehicle speed sensor, a speaker (vibration noise canceller) 18 disposed on a kick panel or the like, and a microphone (error signal detector) 20 disposed in the vicinity of a sound receiving point of a vehicle driver or passenger. The road wheel speed sensor 16 generates a road wheel speed signal Sw represented by a number of pulses per one revolution of the road wheel 22, and outputs the road wheel speed signal Sw to the ANC apparatus 14.

The ANC apparatus 14 is adaptively controlled so as to minimize an error signal e that is detected by the microphone 20, and generates a canceling signal Sca as a corrective control signal.

The speaker 18 outputs a vibration noise canceling sound (also simply referred to as "canceling sound") CS based on the canceling signal Sca for canceling vibration noise NS that is propagated through a passenger compartment 28 of the vehicle 12 based on road-induced vibrations 26 from a road 24.

The microphone 20 detects an error signal e based on the difference between the vibration noise canceling sound CS that is generated by the speaker 18 based on the canceling signal Sca output from the ANC apparatus 14 and the vibration noise NS propagated through the passenger compartment 28 based on the road-induced vibrations 26 from the road 24.

The ANC apparatus 14, which comprises a microcomputer, a DSP, etc., also operates a function performer (function performing means) for performing various functions by executing, by the CPU of the microcomputer, programs stored in a memory such as a ROM based on various input signals.

The active vibration noise control apparatus 10 according to the present embodiment is basically made up of the ANC apparatus 14, the speaker 18, the microphone 20, and the road wheel speed sensor (vehicle speed sensor) 16.

The ANC apparatus 14 includes a reference signal generator 46, which comprises a real-part reference signal generator 42 and an imaginary-part reference signal generator 44, for generating a reference signal X (Rx, Ix) (Rx: a real-part reference signal $\cos 2\pi fct$, Ix: an imaginary-part reference signal $\sin 2\pi fct$) having a frequency fc, a control signal generator 36, which comprises an adaptive notch filter 52 as a SAN (Single Adaptive Notch) filter, etc., for outputting a control signal Sc in response to the input reference signal X (Rx, Ix) and the input error signal e, and a phase/amplitude adjuster 54, which has a phase or amplitude adjusting value to be set therein depending on the frequency fc of the reference signal X, for adjusting the phase or amplitude of the control signal Sc to generate the canceling signal Sca.

The phase or amplitude adjusting value to be set in the phase/amplitude adjuster 54 is stored in a phase/amplitude switcher 50 as a frequency versus phase/amplitude table {the characteristics of a phase delay θd and amplitude (gain) Gd with respect to frequencies fc} 51 that represents a phase and an amplitude depending on the frequency fc of the reference signal X. Values of the phase delay θd and the amplitude (gain) Gd will be described later.

As shown in FIGS. 1 and 2, the control signal generator 36 includes the adaptive notch filter 52 which comprises adaptive notch filters 57, 58 with a real-part filter coefficient Rw and an imaginary-part filter coefficient Iw set respectively therein and a subtractor (combiner) 59, a subtractor 62 serving as a corrective error signal generator for generating a corrective error signal ea by subtracting the control signal Sc before the adjustment, from the error signal e, and a filter coefficient updater 72 for sequentially updating the filter coefficients W (Rw, Iw) of the adaptive notch filter 52 so as to minimize the corrective error signal ea based on the reference signal X (Rx, Ix) and the corrective error signal ea.

The filter coefficient updater 72 includes a real-part filter coefficient updater **72*r* for sequentially updating the real-part filter coefficient Rw of the adaptive notch filter 57 in each sampling time ts, and an imaginary-part filter coefficient updater 72*i* for sequentially updating the imaginary-part filter coefficient Iw of the adaptive notch filter 58. The real-part filter coefficient updater 72*r* comprises a multiplier 112, and a step size parameter assignor 114 for assigning a step size parameter μ. The imaginary-part filter coefficient updater 72*i* comprises a multiplier 116, and a step size parameter assignor 118** for assigning a step size parameter −μ.

The ANC apparatus 14 also includes a frequency switcher 92, which stores therein a vehicle speed versus frequency correspondence table (correspondence characteristics) 100, to be described later, representing a correspondence relation between the vehicle speed Vs of the vehicle 12 and the frequency fc of the reference signal X, for supplying a frequency setting unit 94 with a command to change frequencies fc of the reference signal X by referring to the vehicle speed versus frequency correspondence table 100 depending on the present vehicle speed Vs of the vehicle 12, and a vehicle speed detector 40 for calculating a vehicle speed Vs from the road wheel speed signal Sw.

The phase/amplitude adjuster 54 includes a delay unit (not shown) having an N sampling time delay, which operates as a phase shifter, and an amplitude adjuster (gain adjuster) (not shown) connected in series to the delay unit, as disclosed in JP2009-045954A. The delay unit and the amplitude adjuster (gain adjuster) may be connected in the order named or otherwise. The delay unit applies a given phase delay θd to the control signal Sc that is supplied from the adaptive notch filter 52 of the control signal generator 36, and the amplitude adjuster (gain adjuster) adjusts the amplitude (gain) Gd of the control signal Sc. The phase/amplitude adjuster 54 outputs the adjusted control signal Sc as the canceling signal Sca.

Phase delays θd and amplitudes (gains) Gd to be selectively set in the phase/amplitude adjuster 54 are preliminarily stored in the frequency versus phase/amplitude table 51 of the phase/amplitude switcher 50 in association with frequencies fc.

The phase delays θd are determined in view of the fact that the phase difference between the canceling sound CS and the vibration noise NS is required to be π [rad]=180° (opposite phase) at each frequency fc at the sound receiving point where the microphone 20 is positioned, as disclosed in JP2009-045954A. If it is assumed that the space of the passenger compartment 28 from the speaker 18 to the microphone 20 causes a phase delay θsm for a sine wave sound having a frequency fc produced by the speaker 18, a signal path from the output terminal of the microphone 20 through the control signal generator 36 to the input terminal of the phase/amplitude adjuster 54 causes a phase delay θmd, and a signal path from the output terminal of the phase/amplitude adjuster 54 to the speaker 18 causes a phase delay θds, then the phase delay θd given by the phase/amplitude adjuster 54 is of a value satisfying the following expression (1):

$$\theta d=\pi[\text{rad}]-(\theta md+\theta ds+\theta sm) \tag{1}$$

The amplitudes (gains) Gd may be set to values to compensate for an attenuation of the canceling sound CS that is caused on a sine wave sound by the path from the speaker 18 through the space of the passenger compartment 28 to the microphone 20 at each frequency fc. The amplitudes (gains) Gd may be determined depending on a reduction target for the vibration noise NS.

Figure 3:
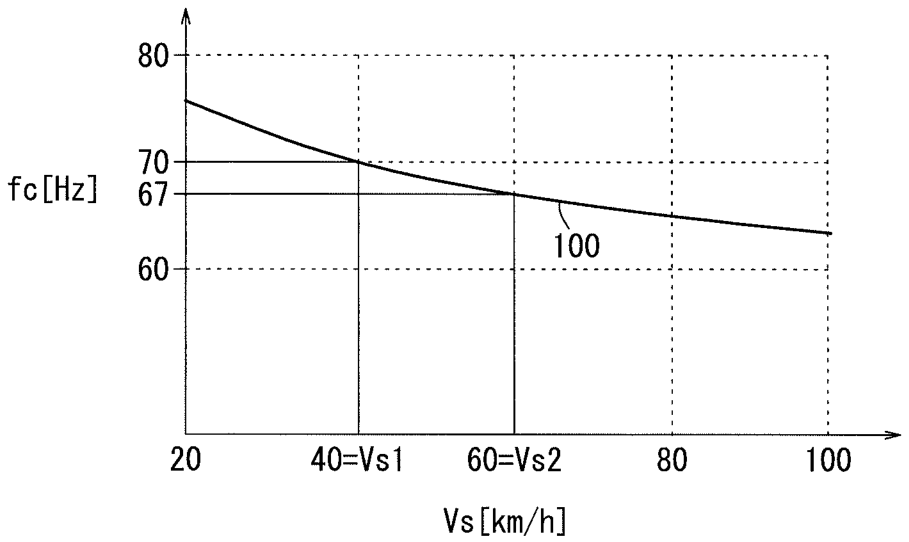
FIG. 3 is a diagram showing a characteristic curve representative of the relationship between vehicle speeds and reference frequencies.

FIG. 3 shows a measured example of the vehicle speed versus frequency correspondence characteristic 100 (Vs-fc correspondence table: vehicle speed versus frequency correspondence table) representative of the correspondence relation between the vehicle speed Vs [km/h] and the frequency fc [Hz] stored in the frequency switcher 92. Though the vehicle speed versus frequency correspondence table 100 has its gradient different for each vehicle type, it has a general tendency for the frequency fc for generating the reference signal X to decrease as the vehicle speed Vs increases. For example, when the vehicle speed Vs is Vs1=40 [km/h] (the certain speed referred to above), the frequency fc is fc=70 [Hz], and when the vehicle speed Vs increases to Vs2=60 [km/h] (the other different speed referred to above), the frequency fc drops to fc=67 [Hz].

Figure 4:
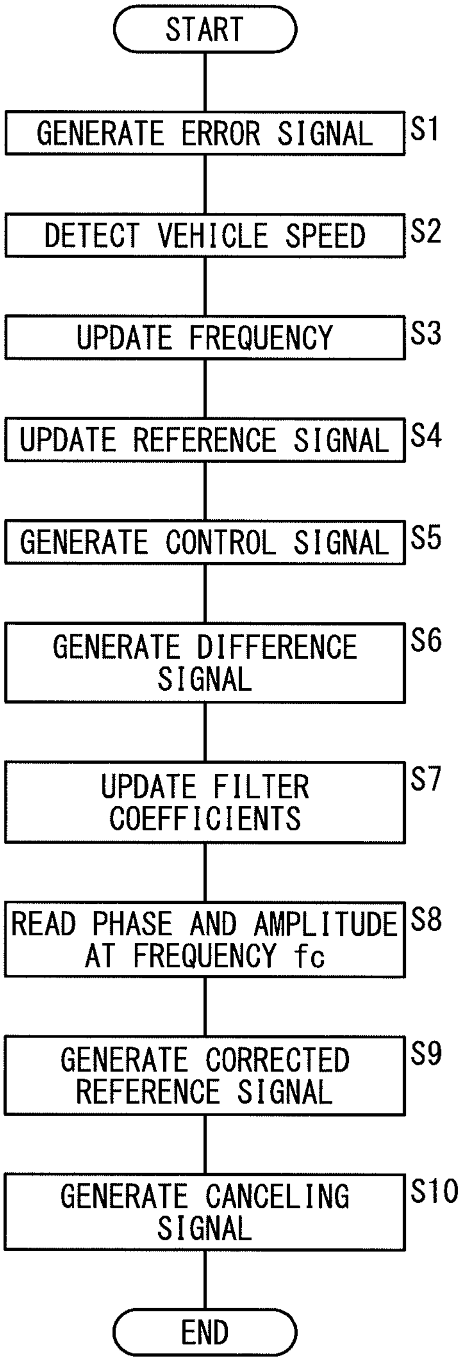
FIG. 4 is a flowchart of an operation sequence of the active vibration noise control apparatus according to the embodiment of the present invention.

The active vibration noise control apparatus 10 according to the present embodiment is basically constructed as described above. Operation of the active vibration noise control apparatus 10 will be described below with reference to a flowchart shown in FIG. 4.

In step S1, the microphone 20 generates an error signal e based on the difference between vibration noise NS representative of road noise and a canceling sound CS, and sends the error signal e to the minuend input terminal of the subtractor 62 of the control signal generator 36.

In step S2, the vehicle speed detector 40 detects a vehicle speed Vs based on the road wheel speed signal Sw from the road wheel speed sensor 16, and sends a vehicle speed signal representing the detected vehicle speed Vs to the frequency switcher 92.

In step S3, the frequency switcher 92 refers to the vehicle speed versus frequency correspondence table 100 shown in FIG. 3, and updates the frequency fc into a frequency depending on the supplied vehicle speed Vs. For example, if the vehicle speed Vs increases from Vs1=40 [km/h] associated with the frequency fc=70 [Hz] to Vs2=60 [km/h], then the frequency switcher 92 updates the frequency fc into a frequency fc=67 [Hz].

In step S4, the real-part reference signal generator 42 of the reference signal generator 46 updates the real-part reference signal Rx into a real-part reference signal Rx (Rx =cos2π·fc·t) depending on the updated frequency fc, and the imaginary-part reference signal generator 44 of the reference signal generator 46 updates the imaginary-part reference signal Ix into an imaginary-part reference signal Ix (Ix=sin2π·fc·t) depending on the updated frequency fc.

In step S5, the adaptive notch filter 52 (adaptive filters 57, 58, and subtractor 59) generates a control signal Sc according to the following expression (2):

$$Sc=Rw\cdot Rx-Iw\cdot Ix \tag{2}$$

In step S6, the subtractor 62 generates a corrective error signal ea as a difference signal according to the following expression (3):

$$ea=e-Sc \tag{3}$$

In step S7, the real-part filter coefficient updater **72*r* and imaginary-part filter coefficient updater 72*i* of the filter coefficient updater 72** update the real-part filter coefficient Rw and the imaginary-part filter coefficient Iw, respectively, so as to minimize the corrective error signal ea=e−Sc at each sampling time is based on an adaptive algorithm, e.g., a least mean square (LMS) algorithm, according to the following expressions (4) and (5), which are known adaptive updating arithmetic expressions:

$$Rw_{n+1}\leftarrow Rw_n+\mu\cdot Rx\cdot(e-Sc) \tag{4}$$

$$Iw_{n+1}\leftarrow Iw_n-\mu\cdot Ix\cdot(e-Sc) \tag{5}$$

In step S8, the phase/amplitude switcher 50 reads a phase delay θd and an amplitude Gd associated with the updated frequency fc in the frequency versus phase/amplitude table 51, and sets the phase delay θd and the amplitude Gd in the phase/amplitude adjuster 54.

In step S9, the phase/amplitude adjuster 54 adjusts the reference signal X (Rx, Ix) in the expression (2) with the phase delay θd and the amplitude Gd, thereby generating a corrected reference signal Xfb (Rxfb, Ixfb) according to the expressions (6), (7) shown below. Specifically, of the control signal Sc=Rw·Rx−Iw·Ix, the real-part reference signal Rx is corrected or adjusted into a real-part reference signal Rxfb, and an imaginary-part reference signal 1*x* is corrected or adjusted into an imaginary-part reference signal Ixfb.

$$Rxfb=Gd\cdot\cos(2\pi\cdot fc\cdot t+\theta d) \tag{6}$$

$$Ixfb=Gd\cdot\sin(2\pi\cdot fc\cdot t+\theta d) \tag{7}$$

In step S10, the phase/amplitude adjuster 54 generates a canceling signal Sca according to the following expression (8), which is obtained by substituting the expressions (6), (7) into the expression (2):

$$Sca=Rw\cdot Rxfb-Iw\cdot Ixfb \tag{8}$$

Since the canceling signal Sca is generated using the corrected reference signal Xfb(Rxfb, Ixfb) with the frequency fc being changed depending on change in the vehicle speed Vs, it is possible to appropriately cancel the vibration noise NS even when the peak-amplitude frequency fc of the vibration noise NS has changed, by use of the canceling sound CS that is output from the speaker 18 based on the canceling signal Sca.

Advantages Of The Embodiment:

The active vibration noise control apparatus 10 according to the present embodiment comprises the speaker 18 as a vibration noise canceller for outputting a canceling sound CS based on a canceling signal Sca to cancel out vibration noise NS, the microphone 20 as an error signal detector for detecting residual noise due to an interference between the vibration noise NS and the canceling sound NS as an error signal e, and the ANC apparatus 14 as an active vibration noise controller for generating a canceling signal Sca in response to the error signal e input to the ANC apparatus 14.

The ANS apparatus 14 includes the reference signal generator 46 for generating a reference signal X having a frequency fc, the adaptive notch filter 52 for outputting a control signal Sc in response to the reference signal X input thereto, the phase/amplitude adjuster 54, which stores therein a phase or amplitude adjusting value (θd, Gd: fc) depending on the frequency fc of the reference signal X, for generating the canceling signal Sca by adjusting the phase or amplitude of the control signal Sc with the phase or amplitude adjusting value (θd, Gd: fc), the subtractor 62 as a corrective error signal generator for generating a corrective error signal ea (ea=e−Sc) by subtracting the control signal Sc before adjustment, from the error signal e, the filter coefficient updater 72 for sequentially updating the filter coefficients Rw, Iw of the adaptive notch filter 52 so as to minimize the corrective error signal ea based on the reference signal X and the corrective error signal ea, the vehicle speed detector 40 for detecting a vehicle speed Vs of the vehicle 12 which incorporates the active vibration noise control apparatus 10, and the frequency switcher 92, which stores therein the vehicle speed versus frequency correspondence table or correspondence characteristics 100 representing a correspondence relation between the vehicle speed Vs of the vehicle 12 and the frequency fc of the reference signal X, for changing the frequency fc of the reference signal X by referring to the vehicle speed versus frequency correspondence table 100 depending on the vehicle speed Vs.

According to the present embodiment, when the vehicle speed Vs changes thereby to change the frequency characteristics of the vibration noise NS, the frequency fc of the reference signal X used by the adaptive notch filter 52 is changed depending on the vehicle speed Vs by referring to the vehicle speed versus frequency correspondence table 100 representative of the correspondence relation between the vehicle speed Vs and the frequency fc. Therefore, the vibration noise NS can be reduced in response to the change in the frequency characteristics of the vibration noise NS.

The vehicle speed versus frequency correspondence table 100 has a region where the frequency fc of the reference signal X decreases as the vehicle speed Vs increases. The vibration noise NS is produced by the road-induced vibrations 26 that are transmitted through the road wheel 22 and the suspension thereof to the passenger compartment 28. When the vibration noise NS is thus transmitted, it is considered to increase due to the resonant frequency of the suspension. In this case, the resonant frequency of the suspension is lowered depending on the vehicle speed Vs. This is considered to be one of the reasons why the frequency fc decreases as the vehicle Vs increases.

The active vibration noise control apparatus 10 includes the phase/amplitude switcher 50 which has the frequency versus phase/amplitude table 51 for changing the adjusting value for the phase delay θd or the amplitude Gd stored (set) in the phase/amplitude adjuster 54 when the frequency switcher 92 changes the frequency fc of the reference signal X. Therefore, the active vibration noise control apparatus 10 may be simplified in structure. Since the canceling signal Sca is generated by adjusting the phase and amplitude of the control signal Sc based on the changed frequency fc, the vibration noise NS can be reduced accurately in response to a change in the frequency characteristics of the vibration noise NS, which is caused by a change in the vehicle speed Vs.

Figure 5A:
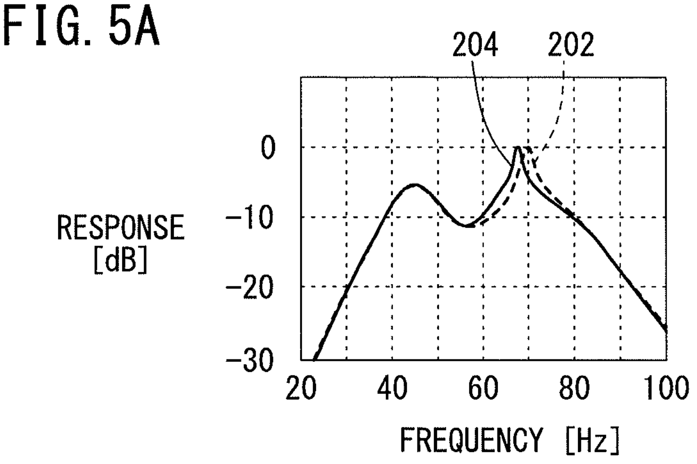
FIG. 5A is a diagram showing the frequency characteristics of vibration noise detected by a microphone when the vehicle is not under active vibration noise control.

FIGS. 5A, 5B, 5C, 6A, and 6B are diagrams illustrative of the advantages of the present embodiment. FIG. 5A is the same diagram as in FIG. 7A, showing the frequency characteristics of vibration noise NS at the position of the microphone 20 when the vehicle 12 is not under active vibration noise control. In FIG. 5A, a broken-line characteristic curve 202 is plotted when the vehicle 12 travels at a vehicle speed Vs1=40 [km/h], and a solid-line characteristic curve 204 is plotted when the vehicle 12 travels at a vehicle speed Vs2=60 [km/h]. It can be understood from FIG. 5A that the peak-amplitude frequency at a maximum amplitude level of 0 [dB] of the frequency characteristic curve 204 at the vehicle speed Vs2 is changed or shifted to a frequency lower than the peak-amplitude frequency of the frequency characteristic curve 202, i.e., from a frequency of 70 [Hz], which is the peak-amplitude frequency at a maximum amplitude level of 0 [dB] of the characteristic curve 202 at the vehicle speed Vs1 (Vs1<Vs2), to a frequency of 67 [Hz].

Figure 5B:
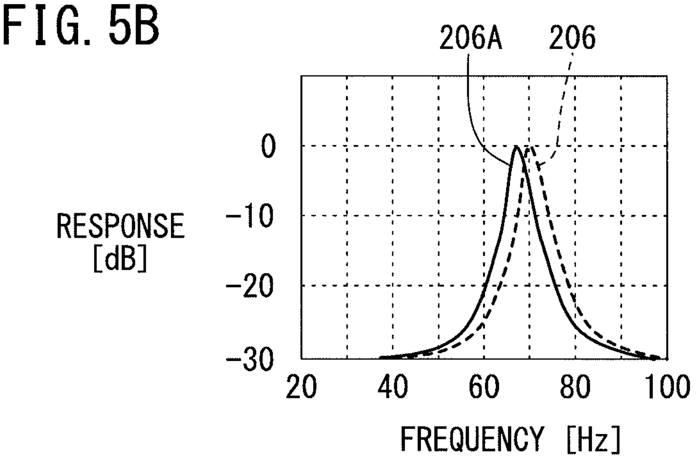
FIG. 5B is a diagram showing how the frequency characteristics of a bandpass filter comprising an adaptive notch filter which is adapted to change as the vehicle speed changes.

In FIG. 5B, when the vehicle speed Vs changes from the vehicle speed Vs1 to the vehicle speed Vs2, the frequency characteristics of the adaptive notch filter 52 as a bandpass filter change from a frequency characteristic curve 206 to a frequency characteristic curve 206A, and the peak-amplitude frequency (central frequency) changes from the frequency of 70 [Hz] to the frequency of 67 [Hz] in accordance with the change of the frequency fc of the reference signal X.

Figure 5C:
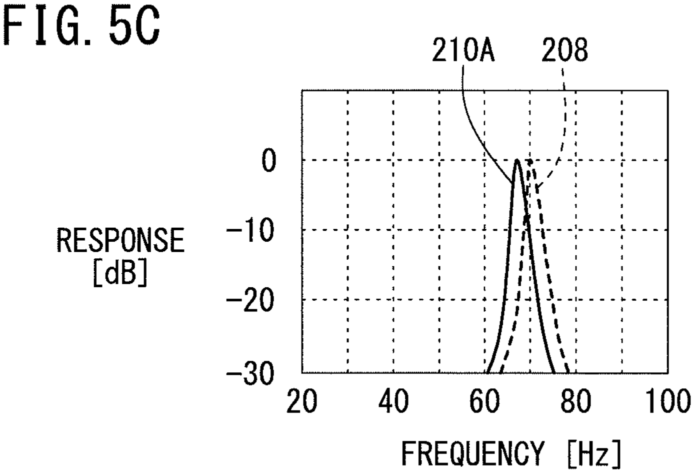
FIG. 5C is a diagram showing the frequency characteristics of control signals at different vehicle speeds.
Figure 7A:
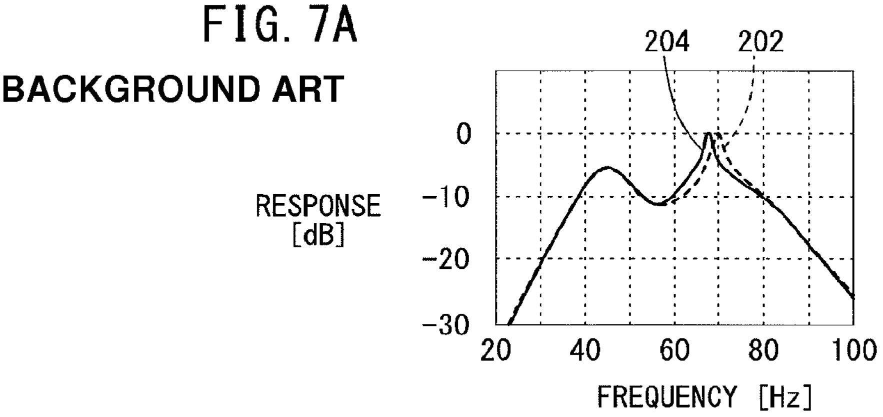
FIG. 7A BACKGROUND ART
FIG. 7A is a diagram which is the same as in FIG. 5A.
Figure 7B:
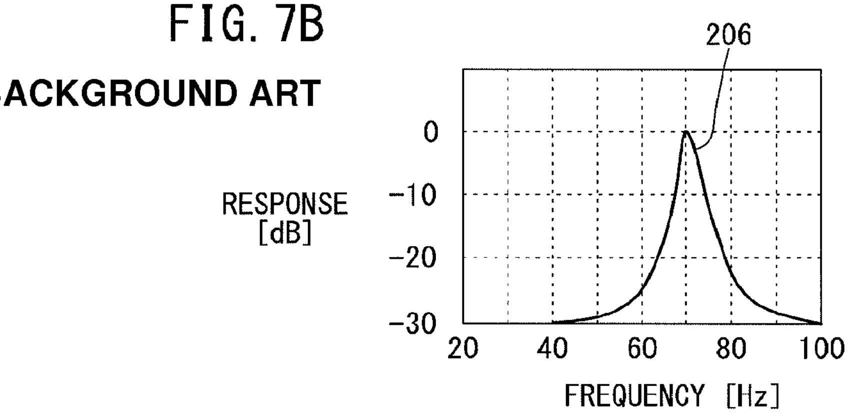
FIG. 7B BACKGROUND ART
FIG. 7B is a diagram showing the frequency characteristics of a bandpass filter which comprises a frequency-fixed adaptive notch filter according to a comparative example.
Figure 7C:
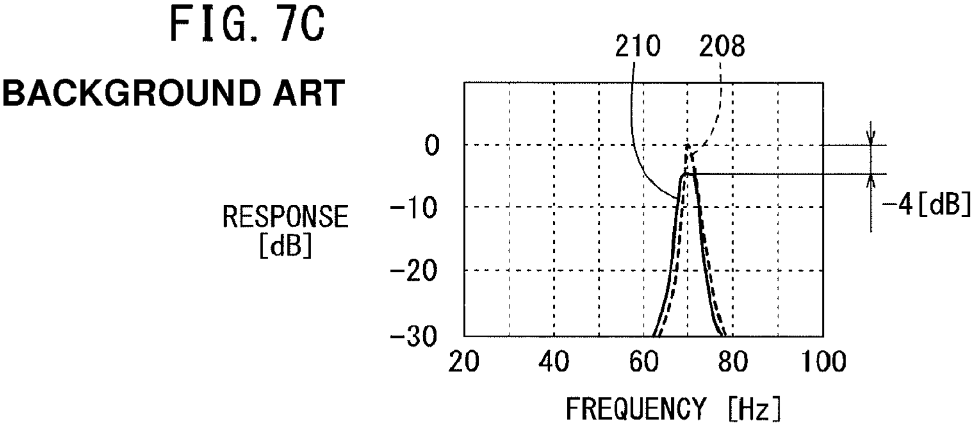
FIG. 7C BACKGROUND ART
FIG. 7C is a diagram showing the frequency characteristics of control signals output from the adaptive notch filter according to the comparative example shown in FIG. 7B before and after the frequency of vibration noise changes.
Figure 8A:
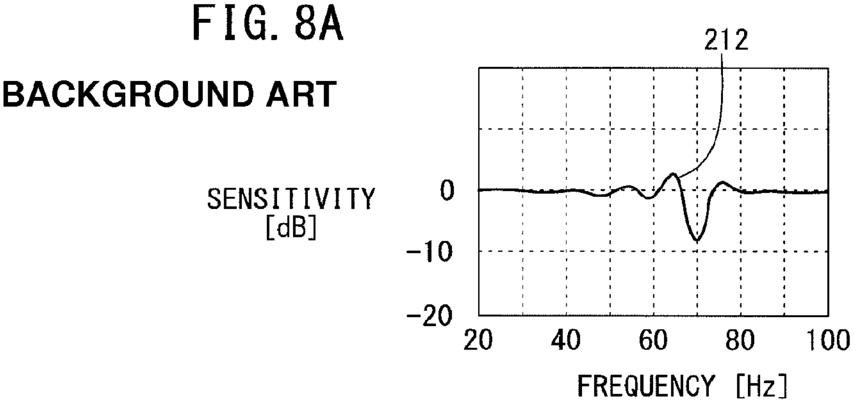
FIG. 8A BACKGROUND ART
FIG. 8A is a diagram showing the frequency characteristics of a sensitivity function according to a comparative example.
Figure 8B:
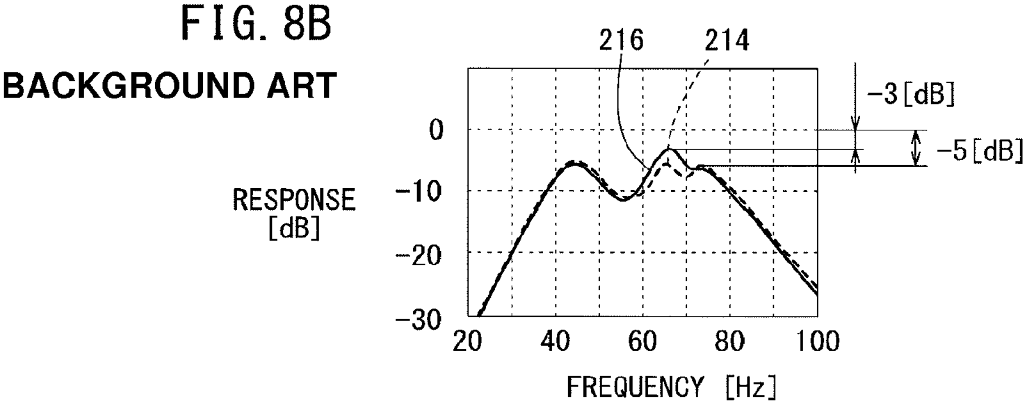
FIG. 8B BACKGROUND ART
FIG. 8B is a diagram showing the frequency characteristics of vibration noise detected by a microphone before and after the frequency thereof changes, using the sensitivity function shown in FIG. 8A.

FIG. 5C shows a broken-line characteristic curve (signal spectrum) 208 of the control signal Sc at the vehicle speed Vs1, and a solid-line characteristic curve 210A of the control signal Sc at the vehicle speed Vs2. The solid-line characteristic curve 210A of the control signal Sc at the vehicle speed Vs2 has its peak amplitude not attenuated, while the characteristic curve 210 according to the comparative example shown in FIG. 7C has its peak amplitude attenuated.

Figure 6A:
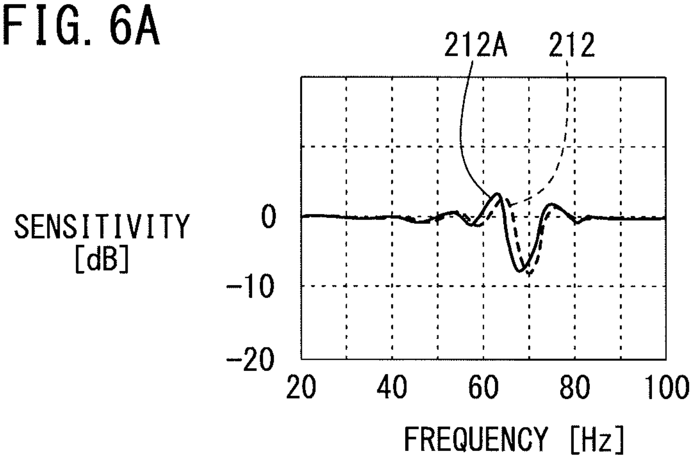
FIG. 6A is a diagram showing a sensitivity function depending on changes in the vehicle speed.

In FIG. 6A, it can be seen that when the vehicle speed Vs changes from the vehicle speed Vs1 to the vehicle speed Vs2, the sensitivity function 212 changes to a sensitivity function 212A.

Figure 6B:
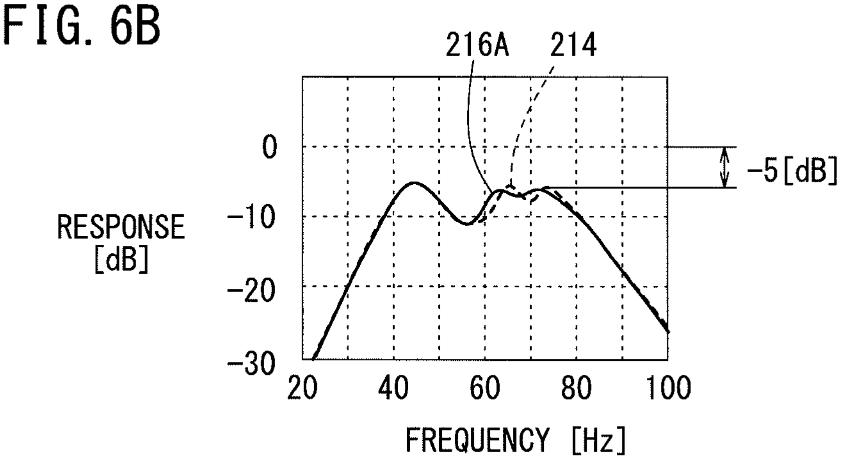
FIG. 6B is a diagram showing the frequency characteristics of vibration noise detected by the microphone when the vehicle is under active vibration noise control, corresponding respectively to the sensitivity functions.

FIG. 6B shows the frequency characteristics of vibration noise NS detected by the microphone 20 when a vibration noise control process is carried out by the active vibration noise control apparatus 10, which has the characteristics represented by the sensitivity function 212, and the sensitivity function 212A. FIG. 6B illustrates a broken-line characteristic curve 214 at the vehicle speed Vs1 and a solid-line characteristic curve 216A at the vehicle speed Vs2. Even when the vehicle speed Vs changes from the vehicle speed Vs1 to the vehicle speed Vs2, the vibration noise is similarly reduced by about −5 [dB]. Therefore, the vibration noise as perceived by passengers in the passenger compartment 28 can similarly be suppressed even when the vehicle speed Vs changes.

Although a certain preferred embodiment of the present invention has been shown and described in detail, it should be understood that various changes and modifications may be made therein without departing from the scope of the appended claims.

What is claimed is:

1. An active vibration noise control apparatus comprising:

a vibration noise canceller for outputting a canceling sound based on a canceling signal to cancel out vibration noise generated inside a passenger compartment of a vehicle by road-induced vibrations;

an error signal detector for detecting residual noise due to an interference between the vibration noise and the canceling sound as an error signal; and an active vibration noise controller for generating the canceling signal in response to the error signal input thereto;

wherein the active vibration noise controller comprises:

a reference signal generator for generating a reference signal having a frequency set based on peak-amplitude frequency of the vibration noise;

an adaptive notch filter for outputting a control signal in response to the reference signal input thereto;

a phase/amplitude adjuster for storing therein a phase or amplitude adjusting value depending on the frequency of the reference signal, and generating the canceling signal by adjusting a phase or amplitude of the control signal with the phase or amplitude adjusting value;

a corrective error signal generator for generating a corrective error signal by subtracting the control signal before the adjustment, from the error signal;

a filter coefficient updater for sequentially updating filter coefficients of the adaptive notch filter so as to minimize the corrective error signal based on the reference signal and the corrective error signal;

a vehicle speed detector for detecting a vehicle speed of a vehicle which incorporates the active vibration noise control apparatus; and a frequency switcher for storing therein vehicle speed versus frequency correspondence characteristics representing a correspondence relation between the vehicle speed of the vehicle and the frequency of the reference signal, and changing the frequency of the reference signal by referring to the vehicle speed versus frequency correspondence characteristics depending on the vehicle speed.

wherein the vehicle speed versus frequency correspondence characteristics have a region where the frequency of the reference signal decreases as the vehicle speed increases, so as to output the canceling sound, by the vibration noise canceller, based on the canceling signal having peak-amplitude frequency that decreases as the vehicle speed increases.

2. The active vibration noise control apparatus according to claim 1, further comprising:

a phase/amplitude switcher for changing the phase or amplitude adjusting value stored in the phase/amplitude adjuster in response to change of the frequency of the reference signal by the frequency switcher.

3. The active vibration noise control apparatus of claim 1, wherein the frequency of the reference signal gradually decreases as the vehicle speed increases.

4. The active vibration noise control apparatus according to claim 1, where the frequency of the reference signal gradually decreases from a value less than 80 Hz and to a value more than 60 Hz as the vehicle speed ranging from 20 to 100 km/hr increases.

5. The active vibration noise control apparatus according to claim 1, wherein the vibration noise canceller comprises a speaker.

6. An active vibration noise control apparatus comprising:

a vehicle vibration noise canceller for outputting a canceling sound based on a canceling signal to cancel out vibration noise generated inside a passenger compartment of a vehicle by road-induced vibrations;

an error signal detector for detecting residual noise due to an interference between the vibration noise and the canceling sound as an error signal; and an active vibration noise controller for generating the canceling signal in response to the error signal input thereto;

wherein the active vibration noise controller comprises:

a reference signal generator for generating a reference signal having a frequency set based on peak-amplitude frequency of the vibration noise;

an adaptive notch filter for outputting a control signal in response to the reference signal input thereto;

a phase/amplitude adjuster for storing therein a phase or amplitude adjusting value depending on the frequency of the reference signal, and generating the canceling signal by adjusting a phase or amplitude of the control signal with the phase or amplitude adjusting value;

a corrective error signal generator for generating a corrective error signal by subtracting the control signal before the adjustment, from the error signal;

a filter coefficient updater for sequentially updating filter coefficients of the adaptive notch filter so as to minimize the corrective error signal based on the reference signal and the corrective error signal;

a vehicle speed detector for detecting a vehicle speed of a vehicle which incorporates the active vibration noise control apparatus; and a frequency switcher for storing therein vehicle speed versus frequency correspondence characteristics representing a correspondence relation between the vehicle speed and the frequency of the reference signal, and changing the frequency of the reference signal by referring to the vehicle speed versus frequency correspondence characteristics depending on the vehicle speed, wherein the vehicle speed versus frequency correspondence characteristics have a region where the frequency of the reference signal gradually decreases as the vehicle speed increases, so as to output the canceling sound, by the vibration noise canceller, based on the canceling signal having peak-amplitude frequency decreases as the vehicle speed increases.

7. The active vibration noise control apparatus according to claim 6, where the frequency of the reference signal gradually decreases from a value less than 80 Hz and to a value more than 60 Hz as the vehicle speed ranging from 20 to 100 km/hr increases.

8. The active vibration noise control apparatus according to claim 6, wherein the vibration noise canceller comprises a speaker.

* * * * *